(12) United States Patent
Hayashi et al.

(10) Patent No.: US 8,183,956 B2
(45) Date of Patent: May 22, 2012

(54) DIPLEXER CIRCUIT, HIGH-FREQUENCY CIRCUIT AND HIGH-FREQUENCY MODULE

(75) Inventors: Kenji Hayashi, Kumagaya (JP); Masayuki Uchida, Tottori-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 642 days.

(21) Appl. No.: 12/304,898

(22) PCT Filed: Jul. 3, 2007

(86) PCT No.: PCT/JP2007/063323
§ 371 (c)(1),
(2), (4) Date: Jan. 14, 2009

(87) PCT Pub. No.: WO2008/004557
PCT Pub. Date: Jan. 10, 2008

(65) Prior Publication Data
US 2009/0295501 A1 Dec. 3, 2009

(30) Foreign Application Priority Data

| Jul. 3, 2006 | (JP) | ............................... | 2006-183224 |
| Jul. 3, 2006 | (JP) | ............................... | 2006-183225 |
| Jul. 3, 2006 | (JP) | ............................... | 2006-183226 |
| Feb. 15, 2007 | (JP) | ............................... | 2007-034436 |

(51) Int. Cl.
*H03H 7/46* (2006.01)
*H01P 3/08* (2006.01)

(52) U.S. Cl. .................... 333/132; 333/126; 333/129

(58) Field of Classification Search .......... 333/126–129, 333/132–134
See application file for complete search history.

(56) References Cited

U.S. PATENT DOCUMENTS 6,683,512 B2 * 1/2004 Nakamata et al. ............ 333/126

FOREIGN PATENT DOCUMENTS

| JP | 9-153840 A | 6/1997 |
| JP | 11-27177 A | 1/1999 |
| JP | 11-55058 A | 2/1999 |
| JP | 2000-349581 A | 12/2000 |
| JP | 2001-217601 A | 8/2001 |
| JP | 2001-352202 A | 12/2001 |
| JP | 2003-69362 A | 3/2003 |
| JP | 2003-168934 A | 6/2003 |
| JP | 2004-328136 A | 11/2004 |
| JP | 2005-80109 A | 3/2005 |
| JP | 2005-323063 A | 11/2005 |

* cited by examiner

*Primary Examiner* — Robert Pascal
*Assistant Examiner* — Kimberly Glenn
(74) *Attorney, Agent, or Firm* — Sughrue Mion, PLLC

(57) ABSTRACT

A diplexer circuit comprising a common terminal, a low-frequency-side terminal, a high-frequency-side terminal, a low-frequency-side path comprising a low-frequency filter disposed between the common terminal and the low-frequency-side terminal, and a high-frequency-side path comprising a high-frequency filter disposed between the common terminal and the high-frequency-side terminal, the low-frequency filter comprising a first transmission line series-connected to the low-frequency-side path and a capacitor parallel-connected to part of the first transmission line.

19 Claims, 10 Drawing Sheets

DIPLEXER CIRCUIT, HIGH-FREQUENCY CIRCUIT AND HIGH-FREQUENCY MODULE

This application is a 371 national phase of International Application No. PCT/JP2007/63323 filed Jul. 3, 2007, claiming the priority of Japanese Patent Application No. 2006-183224 filed Jul. 3, 2006; Japanese Patent Application No. 2006-183225 filed Jul. 3, 2006; Japanese Patent Application No. 2006-183226 filed Jul. 3, 2006; and Japanese Patent Application No. 2007-034436 filed Feb. 15, 2007, all of which are hereby incorporated by reference.

FIELD OF THE INVENTION

The present invention relates to a diplexer circuit used for mobile communications apparatuses such as cell phones, and wireless communications apparatuses between electronic apparatuses, electric apparatuses, etc., a high-frequency circuit, and a high-frequency module having such a high-frequency circuit.

BACKGROUND OF THE INVENTION

There are various systems using TDMA (time division multiple access) for mobile communications, for instance, EGSM (extended global system for mobile communications) and DCS (digital cellular system) widely used mostly in Europe, PCS (personal communications service) widely used in the U.S., and PDC (personal digital cellular system) used in Japan. Conventionally proposed as small, lightweight, high-frequency circuit devices adapted to pluralities of systems are, for instance, dual-band, high-frequency switch modules for use in mobile communications equipments adapted to two systems of EGSM and DCS, triple-band, high-frequency switch modules for use in mobile communications equipments adapted to three systems of EGSM, DCS and PCS, etc. Wireless LAN data communications according to the IEEE802.11 standard, etc. are widely used at present, and this wireless LAN standard includes pluralities of standards having different frequency bands, etc. Various high-frequency circuits are used in wireless-LAN, multiband communications apparatuses.

When one cell phone is used in pluralities of frequency bands, the cell phone should have a high-frequency switch module comprising a circuit for branching transmission signals and received signals in pluralities of frequency bands transmitted from and received by an antenna, and a switch for switching a transmission path and a reception path. The high-frequency switch module, a key part for multiband, wireless communications, is strongly demanded to be made smaller and higher in performance, and the removal of noises in unnecessary bands is indispensable.

To meet such demand, JP 11-27177 A proposes a high-frequency switch comprising filters whose number is reduced by utilizing floating capacitance generated between an antenna and the ground to remove harmonic distortion generated in a transmission signal from a power amplifier. This high-frequency switch has an attenuation pole in a third-harmonic band by adjusting floating capacitance generated between an antenna terminal, transmission circuit terminals and receiving circuit terminals and the ground, and adjusting the length of transmission lines constituting choke elements to substantially λ/6. Although a specific adjusting method is not described, it is extremely complicated to adjust all of these floating capacitances while adjusting the transmission lines to desired length. Although attenuation should be conducted to a level of about seventh harmonics, for instance, in a GSM system, this method cannot attenuate such high-order harmonics because it uses only an attenuation pole of third harmonics.

JP 2003-69362 A proposes a diplexer comprising a parallel resonance circuit having a resonance frequency equal to the frequency of second harmonics on the side of a lowpass filter terminal to remove second harmonics efficiently. With the parallel resonance circuit connected to common terminal and the lowpass filter terminal, this diplexer efficiently removes harmonics having two times as large frequency as a first frequency on the low-frequency side, while reducing signal loss. Specifically, the lowpass filter circuit in the diplexer comprises two parallel resonance circuits constituted by coils and capacitors, with grounded capacitance connected to a connecting point of these parallel resonance circuits and the lowpass filter terminal. However, two parallel resonance circuits make the diplexer larger with a more complicated circuit structure. Also, a multi-stage lowpass filter provides large insertion loss, deteriorating the characteristics. In addition, because the lowpass filter circuit in this diplexer is designed to attenuate two times as large frequency as the first frequency, or a second frequency, it cannot sufficiently attenuate unnecessary bands other than n-th order harmonics.

When both circuits for EGSM and DCS in different frequency bands of 900 MHz and 1800 MHz, respectively, are used, interference occurs to cause the leakage of signals and the deterioration of isolation characteristics. This problem becomes conspicuous as high-frequency devices are made smaller. Against this backdrop, JP 2001-352202 A proposes a high-frequency switch module handling pluralities of transmission/receiving systems having different passbands, in which one transmission/receiving system and the other transmission/receiving system are disposed in different regions of a laminate in a plane direction. However, their formation in different regions of the laminate in a plane direction does not provide sufficient shielding between one transmission/receiving system and the other transmission/receiving system.

With respect to a lowpass filter used in a high-frequency switch module, JP 2004-328136 A proposes a lowpass filter comprising a series resonance circuit and a parallel resonance circuit connected in series for improving the attenuation characteristics of second and third harmonics in signal waves (fundamental waves), with grounded capacitances connected to both ends of the parallel resonance circuit, and with a phase-adjusting transmission line disposed between the series resonance circuit and the parallel resonance circuit. However, the attenuation characteristics and insertion loss of this lowpass filter are not necessarily sufficient to the demand of higher performance accompanied by increase in the number of bands, etc. Also, when composite filters each comprising a lowpass filter and a notch filter are connected via transmission lines, unnegligible deterioration of characteristics occurs due to electromagnetic interference and parasitic capacitance between circuits, and between filter-constituting transmission lines and capacitances. In addition, composite filters sacrifice the demand of miniaturization to improve characteristics. In the course of increasing the integration of laminate modules, it is difficult to design the arrangement of elements such as inductors, etc. constituting lowpass filters and laminate modules comprising them, which meets the demands of smaller size and higher performance.

OBJECTS OF THE INVENTION

Accordingly, the first object of the present invention is to provide a diplexer circuit in which unnecessary bands are reduced while suppressing the increase of insertion loss, without making its circuit more complicated and larger.

The second object of the present invention is to provide a high-frequency circuit comprising such a diplexer circuit.

The third object of the present invention is to provide a high-frequency module having such a high-frequency circuit formed in a multilayer substrate.

The fourth object of the present invention is to provide a high-frequency module in which interference and signal leakage are suppressed between transmission and receiving circuits having different frequency bands without increasing the mounting area.

The fifth object of the present invention is to provide a high-frequency module comprising a lowpass filter having excellent filtering performance, in which inductors and capacitors are easily designed.

DISCLOSURE OF THE INVENTION

The first diplexer circuit of the present invention comprises a common terminal, a low-frequency-side terminal, a high-frequency-side terminal, a low-frequency-side path comprising a low-frequency filter disposed between the common terminal and the low-frequency-side terminal, and a high-frequency-side path comprising a high-frequency filter disposed between the common terminal and the high-frequency-side terminal, the low-frequency filter comprising a first transmission line series-connected to the low-frequency-side path and a capacitor parallel-connected to part of the first transmission line. This diplexer circuit can be miniaturized, because a parallel resonance circuit for suppressing unnecessary bands is constituted by using part of the first transmission line in the low-frequency-side path.

In the above diplexer circuit, it is preferable that the capacitor is parallel-connected to part of the first transmission line on the side of the low-frequency-side terminal to constitute a parallel resonance circuit, and that the other part of the first transmission line constitutes an inductance element. In the first transmission line in the low-frequency filter, a portion constituting an inductance element is disposed on the common terminal side, and a portion constituting the parallel resonance circuit is disposed on the side of the low-frequency-side terminal, to expand the degree of freedom in the arrangement of the parallel resonance circuit. One end of the capacitor may be connected in parallel to part of the first transmission line, and the other end of the capacitor may be connected to another circuit element connected to the low-frequency-side terminal.

The second diplexer circuit of the present invention comprises a common terminal, a low-frequency-side terminal, a high-frequency-side terminal, a low-frequency-side path comprising a low-frequency filter disposed between the common terminal and the low-frequency-side terminal, and a high-frequency-side path comprising a high-frequency filter disposed between the common terminal and the high-frequency-side terminal, parasitic capacitance generated on the side of the common terminal being used as a capacitor for suppressing unnecessary waves. When the common terminal of this diplexer circuit is connected to another circuit element, the above parasitic capacitance functions as a capacitance element, thereby improving design efficiency and the degree of freedom. For instance, when the above common terminal is connected to an antenna, the above parasitic capacitance can be attached to an antenna terminal, thereby suppressing harmonics.

In the above diplexer circuit, the high-frequency filter may comprise a first capacitor connected to the common terminal, the parasitic capacitance being generated on the common terminal side of the first capacitor.

In the above diplexer circuit, one of opposing electrodes constituting the first capacitor, which is connected to the common terminal, is preferably opposing a ground electrode, thereby generating the parasitic capacitance between both electrodes. Utilizing an electrode on the connecting terminal side for one of capacitors constituting the diplexer circuit, which is connected to the common terminal, parasitic capacitance can be generated efficiently with a simple structure, thereby avoiding size increase of the circuit.

In the above diplexer circuit, the high-frequency filter preferably comprises a first capacitor connected to the common terminal, a second capacitor connected between the first capacitor and the high-frequency-side terminal, and a series resonance circuit comprising a third transmission line and a third capacitor between a connecting point of the first capacitor and the second capacitor and the ground, the third transmission line and the first to third capacitors being formed in a laminate comprising dielectric layers provided with electrode patterns, and one of opposing electrodes constituting the first capacitor in the laminate, which is connected to the common terminal, being opposing a ground electrode. Because one of electrodes for capacitors constituting the diplexer circuit, which is connected to the common terminal, is opposing the ground electrode, parasitic capacitance can be generated efficiently, and easily adjusted by changing a ground electrode area, the distance between one of opposing electrodes constituting the first capacitor, which is connected to the common terminal, and the ground electrode, etc.

The first high-frequency circuit of the present invention comprises the first diplexer circuit, and a second transmission line connected to the low-frequency-side terminal, the capacitor being parallel-connected to part of the first transmission line and at least part of the second transmission line. Because a parallel resonance circuit for suppressing unnecessary bands is constituted using the first transmission line and a transmission line of another circuit connected to the low-frequency-side terminal, the diplexer circuit can be made smaller. Also, because the capacitor is bridging the first transmission line and the second transmission line, the arrangement of the capacitor is easy when this high-frequency circuit is formed in a multilayer substrate.

The above high-frequency circuit preferably comprises a switch circuit connected to the low-frequency-side terminal for switching a transmission-side path and a receiving-side path in the low-frequency-side path, the second transmission line being a transmission line disposed in the receiving-side path of the switch circuit. This structure provides a small high-frequency circuit comprising a switch circuit downstream of the diplexer circuit, and suppressing unnecessary bands.

The first high-frequency module of the present invention has the diplexer circuit or the high-frequency circuit formed in a multilayer substrate comprising dielectric layers provided with electrode patterns. This structure provides a small high-frequency circuit suppressing unnecessary bands.

In the above high-frequency module, electrode patterns constituting part of the first transmission line, electrode patterns constituting at least part of the second transmission line, and the capacitor electrode patterns are preferably overlapping in the laminate in a lamination direction. This structure can make the parallel resonance circuit smaller, advantageous in miniaturizing a high-frequency module.

The second high-frequency module of the present invention comprises the second diplexer circuit formed in a multilayer substrate comprising dielectric layers provided with electrode patterns. When the common terminal of this diplexer circuit is connected to another circuit element, the parasitic capacitance functions as a capacitance element, improving the efficiency and degree of freedom of designing a high-frequency module.

The above high-frequency module preferably comprises a first switch circuit for switching a transmission system and a receiving system in the first frequency band branched by the diplexer circuit, and a second switch circuit for switching a transmission system and a receiving system in the second frequency band branched by the diplexer circuit. When the diplexer circuit of the high-frequency antenna switch module having such a structure is connected to an antenna, parasitic capacitance generated in the diplexer circuit can be attached to an antenna terminal, thereby suppressing harmonics.

The third high-frequency module of the present invention is used in a multiband wireless communications apparatus selectively using at least a first frequency band and a second frequency band higher than the first frequency band, comprising a diplexer circuit for branching a first transmission/receiving system in the first frequency band and a second transmission/receiving system in the second frequency band, a first switch circuit connected to the diplexer circuit for switching a transmission system and a receiving system in the first transmission/receiving system, and a second switch circuit connected to the diplexer circuit for switching a transmission system and a receiving system in the second transmission/receiving system; the diplexer circuit and the first and second switch circuits being formed in or on a laminate comprising dielectric layers provided with electrode patterns; among transmission lines for the diplexer circuit and the first and second switch circuits, transmission lines through which signals in the first frequency band pass being formed on one side of a ground electrode formed on a dielectric layer in the laminate in a lamination direction, and transmission lines through which signals in the second frequency band pass being formed on the other side of the ground electrode in a lamination direction.

Because transmission lines through which signals in the first frequency band pass and transmission lines through which signals in the second frequency band pass are separated by the ground electrode in a lamination direction in the diplexer circuit, etc., interference between both transmission and receiving circuits, and the leakage of signals and unnecessary harmonics can be suppressed. Because transmission lines through which signals in the first frequency band pass and transmission lines through which signals in the second frequency band pass are separated in a lamination direction, it is possible to avoid plane size increase for the separation of both circuits.

In addition to those for the first and second frequency bands, transmission and receiving circuits for a third frequency band having a different frequency band, etc. may be added. In this case, both of transmission lines for signals in third and fourth frequency bands are preferably formed on one side of the ground electrode.

In the third high-frequency module, the second frequency band is preferably substantially the same as the frequency band of second harmonics in the first frequency band. When the second frequency band is substantially the same as the frequency band of second harmonics in the first frequency band, the leakage, etc. of unnecessary harmonics in the first frequency band have large influence on signals in the second frequency band. Accordingly, the third high-frequency module having sure shielding between the first frequency band and the second frequency band is particularly effective.

To suppress harmonics, the third high-frequency module preferably comprises a lowpass filter comprising an inductance-constituting transmission line and a capacitor, dielectric layers on which electrode patterns constituting the transmission line are formed and dielectric layers on which electrode patterns constituting the capacitor are formed being separated by a ground electrode in a lamination direction, and no opposing ground electrode being formed on the opposite side of the ground electrode in a lamination direction with respect to the electrode patterns constituting the transmission line. In this case, one side of the ground electrode is an inductance-forming portion, and the other side of the ground electrode is a capacitor-forming portion, in a lamination direction. In this structure, because a ground electrode is disposed between the transmission line and the capacitor, interference is prevented between the transmission line and the capacitor, thereby improving filtering performance, and making the designing of the transmission line and the capacitor easy.

The third high-frequency module preferably does not comprise an opposing ground electrode on the opposite side of the ground electrode in a lamination direction with respect to the electrode patterns constituting the capacitor. This structure can miniaturize the lowpass filter.

The above high-frequency module preferably comprises pluralities of the capacitors. When comprising pluralities of capacitors like a π-type or ladder-type lowpass filter, etc., the close arrangement of capacitors and inductance is likely to cause interference. On the other hand, the formation of pluralities of capacitors on one side of the ground electrode in a lamination direction can effectively suppress interference between inductance-constituting transmission lines and capacitors. Pluralities of inductance-constituting transmission lines may be used like a ladder-type lowpass filter. In this case, the transmission lines are formed on the opposite side of the capacitor with respect to the ground electrode.

In the above high-frequency module, at least one of the capacitors may be connected in parallel to the transmission lines. This structure can also effectively suppress interference between the transmission lines and the capacitors.

BRIEF DESCRIPTION OF THE DRAWINGS

FIG. 17(*b*) is a schematic cross-sectional view showing another example of the lowpass filter used in the present invention.

DESCRIPTION OF THE BEST MODE OF THE INVENTION

[1] First Embodiment (A) Diplexer Circuit

Figure 1:
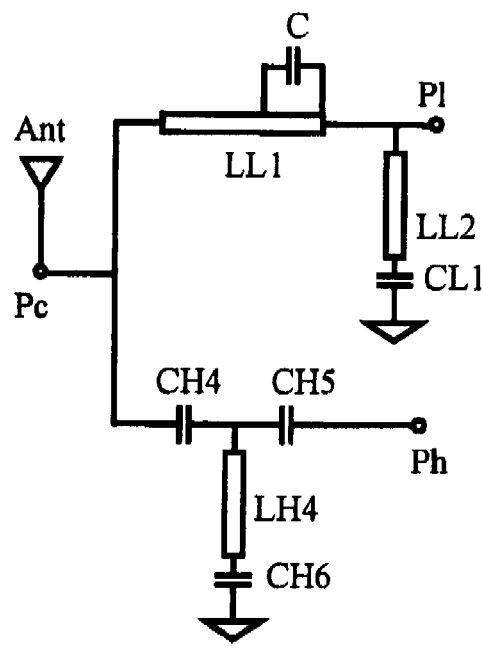
FIG. 1 is a view showing an equivalent circuit of the diplexer circuit according to one embodiment of the present invention.

FIG. 1 shows an equivalent circuit of the diplexer circuit according to one embodiment of the present invention. The diplexer circuit has a function of passing a transmission signal through a high-frequency-side transmission circuit or a low-frequency-side transmission circuit during transmission, while branching received signals having different frequencies to a high-frequency-side receiving circuit or a low-frequency-side receiving circuit during reception. The diplexer circuit shown in FIG. 1 comprises a common terminal Pc, a low-frequency-side terminal P1, a high-frequency-side terminal Ph, a low-frequency filter, and a high-frequency filter, these filters acting to branch a signal path connected to the common terminal Pc to a low-frequency-side path between the common terminal Pc and the low-frequency-side terminal P1, and a high-frequency-side path between the common terminal Pc and the high-frequency-side terminal Ph.

The low-frequency filter comprises a first transmission line LL1 disposed between the common terminal Pc and the low-frequency-side terminal P1, and a series resonance circuit comprising a transmission line LL2 having one end connected between the first transmission line LL1 and the low-frequency-side terminal P1 and the other end connected to the ground, and a first capacitor CL1. With the resonance frequency of the series resonance circuit of the transmission line LL2 and the first capacitor CL1 set equal to the frequency of a high-frequency-side signal, for instance, the high-frequency-side signal can be prevented from entering the low-frequency-side path. In this embodiment, a capacitor C is connected in parallel to part of the first transmission line LL1 on the side of the low-frequency-side terminal P1 in the low-frequency filter, thereby constituting a parallel resonance circuit. The remaining part of the first transmission line LL1 on the side of the common terminal Pc constitutes an inductor. Because part of the first transmission line LL1 constitutes a parallel resonance circuit with the capacitor C, it is possible to avoid the low-frequency filter circuit from becoming larger by the addition of the parallel resonance circuit. Although the capacitor C is parallel-connected to part of the first transmission line LL1 in the example shown in FIG. 1, this structure is not restrictive, but the capacitor C may be parallel-connected to a portion including another circuit element series-connected to the first transmission line LL1. Apart from the series resonance circuit and the parallel resonance circuit comprising part of the first transmission line LL1 and the capacitor C, the structure shown in FIG. 1 is not restrictive, but other structures may be adopted.

The high-frequency filter comprises second and third capacitors CH4, CH5 connected between the common terminal Pc and the high-frequency-side terminal Ph, and a series resonance circuit comprising a transmission line LH4 and a fourth capacitor CH6 connected between a connecting point of the second and third capacitors CH4, CH5 and the ground. However, the high-frequency filter is not restricted to this circuit structure, but proper modification can be made.

The diplexer circuit having a structure in which part of the first transmission line LL1 and the capacitor C are connected in parallel can be formed in a multilayer substrate comprising dielectric layers provided with electrode patterns. For instance, electrode patterns for the capacitor C are formed on adjacent dielectric layers such that they oppose part of electrode patterns for the first transmission line LL1 formed on dielectric layers, and ends of these electrode patterns are connected to the low-frequency-side terminal P1. Part of the first transmission line LL1 may be wider than the other portion.

(B) High-Frequency Circuit

Figure 2:
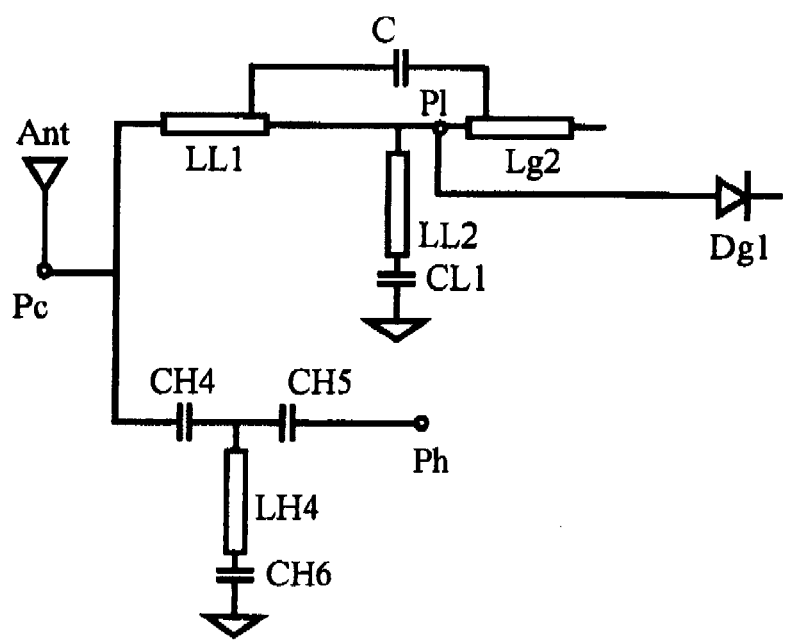
FIG. 2 is a view showing an equivalent circuit of the high-frequency circuit according to another embodiment of the present invention.

FIG. 2 shows an equivalent circuit of the high-frequency circuit according to one embodiment of the present invention. This high-frequency circuit comprises a diplexer circuit, a second transmission line Lg2 in a downstream circuit connected to the low-frequency-side terminal P1 of the diplexer circuit, and a capacitor C connected in parallel to part of the first transmission line LL1 on the side of the low-frequency-side terminal P1 and at least part of the second transmission line Lg2 on the side of the low-frequency-side terminal P1. In the example shown in FIG. 2, the downstream circuit is a switch circuit (circuit structure will be described below) for switching a transmission-side path and a receiving-side path in the low-frequency-side path. The second transmission line Lg2 is disposed in the receiving-side path of the switch circuit. FIG. 2 also shows a diode Dg1 in the switch circuit connected to the low-frequency-side terminal P1.

Because the first transmission line LL1 in the low-frequency filter in the diplexer circuit, the second transmission line Lg2 in the receiving-side path in the switch circuit, and the capacitor C parallel-connected to them constitute a parallel resonance circuit, the circuit is not made larger. With the resonance frequency of this parallel resonance circuit adjusted to other bands than the frequencies of received signals, wide unnecessary bands can be attenuated. Because the other circuit structure such as a high-frequency filter, etc., may be the same as shown in FIG. 1, its explanation will be omitted. The capacitor C may be parallel-connected to part or all of the second transmission line Lg2.

The high-frequency circuit shown in FIG. 2 can be formed in a multilayer substrate comprising dielectric layers provided with electrode patterns, to constitute a high-frequency module. Examples of the high-frequency module include an antenna switch module for switching a transmission system connected to an antenna and a receiving signal path, a composite module integrally comprising the above antenna switch module and a high-frequency amplifier module comprising a high-frequency amplifier circuit for amplifying a transmitting signal, etc., though not restrictive.

Figure 3:
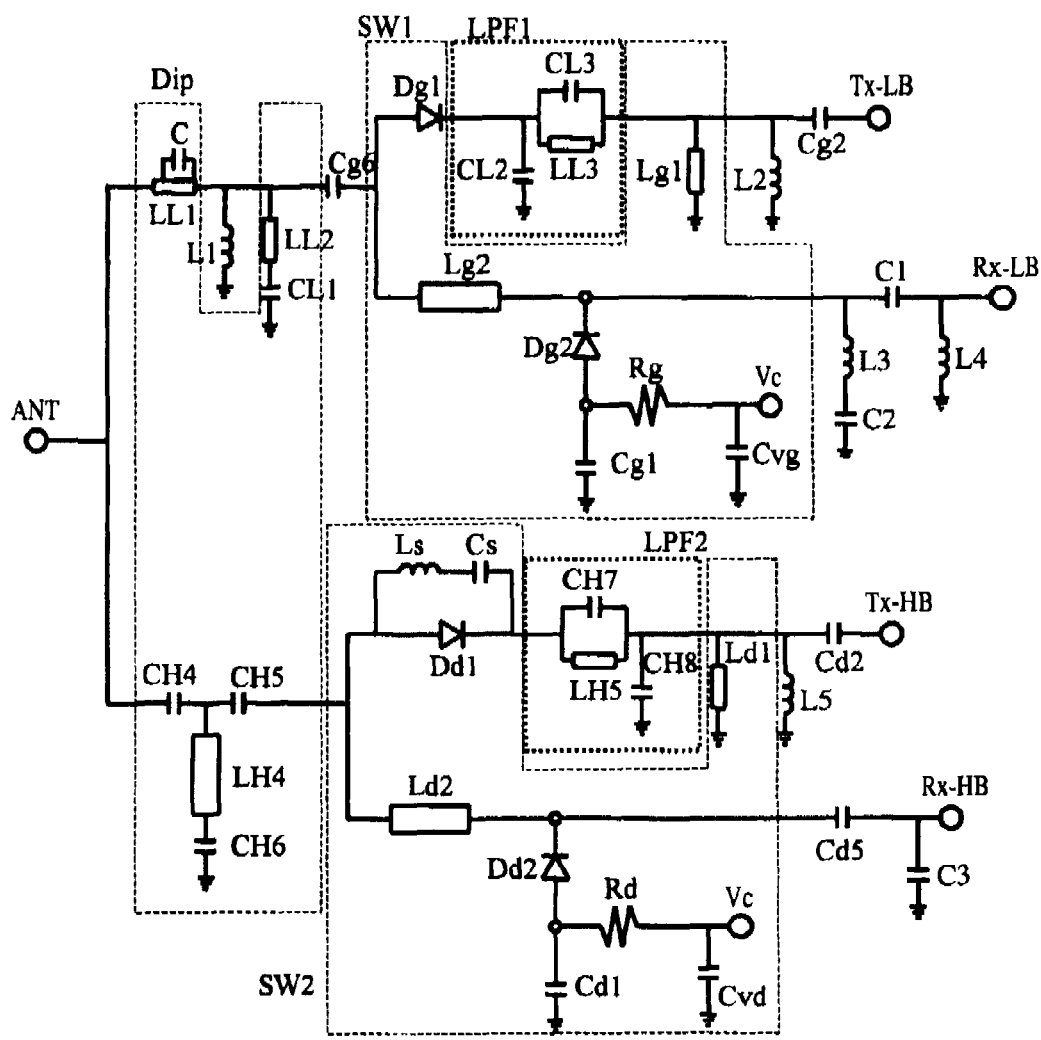
FIG. 3 is a view showing an equivalent circuit of the quad-band antenna switch circuit of the present invention.

As the high-frequency module according to one embodiment of the present invention, FIG. 3 shows an equivalent circuit of a quadband antenna switch circuit using low-frequency bands comprising a GSM850 band (transmission frequency: 824-849 MHz, and receiving frequency: 869-894 MHz) and an EGSM band (transmission frequency: 880-915 MHz, and receiving frequency: 925-960 MHz), and high-frequency bands comprising a DCS band (transmission frequency: 1710-1785 MHz, and receiving frequency: 1805-1880 MHz) and a PCS band (transmission frequency: 1850-1910 MHz, and receiving frequency: 1930-1990 MHz). This antenna switch circuit comprises a diplexer circuit Dip comprising a low-frequency filter and a high-frequency filter, a first switch circuit SW1 disposed downstream of the low-frequency filter of the diplexer circuit for switching a transmission terminal Tx-LB and a receiving terminal Rx-LB by voltage supplied from a control terminal Vc, and a second switch circuit SW2 disposed downstream of the high-frequency filter of the diplexer circuit for switching a transmission terminal Tx-HB and a receiving terminal Rx-HB by voltage supplied from a control terminal Vc. The transmission terminal Tx-LB and the receiving terminal Rx-LB on the low-frequency side are commonly used in GSM and EGSM, and the transmission terminal Tx-HB and the receiving terminal Rx-HB on the high-frequency side are commonly used in DCS and PCS. The receiving terminal Rx-LB on the low-frequency side and the receiving terminal Rx-HB on the high-frequency side are selectively used depending on regions in which mobile terminals comprising this module are used. For instance, Europe uses Rx-LB for EGSM and Rx-HB for DCS, and the U.S. uses Rx-LB for GSM and Rx-HB for PCS. In this case, each transmission/receiving terminal needs a wide band design having the desired characteristics in a low-frequency band of GSM850 and EGSM and a high-frequency band of DCS and PCS. Downstream of the receiving terminal Rx-LB on the low-frequency side and the receiving terminal Rx-HB on the high-frequency side may be a switch circuit (not shown) with four receiving terminals.

The high-frequency switch module is not restricted to quadband, but may be triple- or dual-band. For instance, a first frequency band may be one of GSM 850 and EGSM in the low-frequency band, and a second frequency band may be one of DCS and PCS in the high-frequency band. The high-frequency module is not restricted to communications systems for cell phones, but may be for other communications systems for wireless LAN, etc. The number and arrangement of circuit elements in a filter circuit, a switch circuit, a detection circuit, a balanced-to-unbalanced circuit, etc. used for the high-frequency circuit and the high-frequency module may be changed, if necessary.

In the antenna switch circuit shown in FIG. 3, the diplexer circuit Dip comprising a low-frequency filter and a high-frequency filter for branching transmission and receiving systems in the first frequency band transmission and receiving systems in the second frequency band comprises a lowpass filter as a low-frequency-side (GSM/EGSM side) filter for passing transmission signals and received signals of GSM and EGSM while attenuating transmission signals and received signals of DCS and PCS, and a highpass filter as a high-frequency-side (DCS/PCS side) filter for passing the transmission signals and received signals of DCS and PCS while attenuating the transmission signals and received signals of GSM and EGSM. The low-frequency filter and the high-frequency filter connected to an antenna terminal Ant, a common terminal, are respectively constituted by transmission lines and capacitors, but may be constituted by a bandpass filter or a notch filter.

In the lowpass filter as a low-frequency-side (GSM/EGSM side) filter, a transmission line LL1 passes signals in a low-frequency band (GSM and EGSM) with low loss, but has high impedance to signals in a high-frequency band (DCS and PCS), thereby preventing signals in the DCS and PCS band from passing. A transmission line LL1 preferably has such length that it has high impedance in the frequencies of signals in the DCS and PCS band to prevent the signals in the DCS and PCS band from being transmitted to a GSM path. A transmission line LL2 and a capacitor CL1 constitute a series resonance circuit having a resonance frequency in the DCS and PCS band, so that signals in the DCS and PCS band are grounded and thus prevented from entering a low-frequency path. In the highpass filter as a high-frequency-side (DCS/PCS Side) filter, capacitors CH4, CH5 pass signals in the high-frequency band (DCS and PCS) with low loss, but has high impedance to signals in the low-frequency band (GSM and EGSM), thereby preventing signals in the GSM and EGSM band from passing. A transmission line LH4 and a capacitor CH4 constitute a series resonance circuit having a resonance frequency in the GSM and EGSM band, so that signals in the GSM and EGSM band are grounded and thus prevented from entering a high-frequency path.

The switch circuit shown in FIG. 3 comprises a first switch circuit SW1 connected to the diplexer circuit for switching a transmission system (transmission terminal Tx-LB) and a receiving system (receiving terminal Rx-LB) in the first transmission/receiving system, and a second switch circuit SW2 connected to the diplexer circuit for switching a transmission system (transmission terminal Tx-HB) and a receiving system (receiving terminal Rx-HB) in the second transmission/receiving system. Any of the first and second switch circuits SW1, SW2 comprises switch elements and transmission lines as main elements. The switch elements are preferably PIN diodes, but GaAs switches can be used. Switch circuits comprising PIN diodes are cheaper than those comprising GaAs switches, but the GaAs switches can be operated with lower power consumption than switch circuits comprising the PIN diodes. Accordingly, they are selected to exhibit their advantages.

The first switch circuit SW1 (upper side in FIG. 3) for switching a transmission terminal Tx-LB and a receiving terminal Rx-LB for GSM/EGSM comprises two diodes Dg1, Dg2 and two transmission lines Lg1, Lg2 as main elements. The diode Dg1 is disposed between the low-frequency filter of the diplexer circuit and the transmission terminal Tx-LB, an anode of the diode Dg1 being connected to the low-frequency filter of the diplexer circuit, and a cathode of the diode Dg1 being connected to an L-type lowpass filter LPF1 constituted by a transmission line LL3 and capacitors CL2, CL3. A transmission line Lg1 is connected between the other end of the transmission line LL3 constituting the lowpass filter LPF1 and the ground. Because the lowpass filter LPF1 suppresses only high-order harmonic distortion contained in a transmission signal input from a power amplifier (not shown) on the GSM/EGSM side, it preferably passes transmitting signals of GSM/EGSM, but sufficiently attenuates two times or more as large frequencies as that of the transmission signal of GSM/ EGSM. To sufficiently attenuate only harmonic distortion contained in the transmission signal of GSM/EGSM input from a power amplifier, the inductance-generating transmission line LL3 and the capacitor CL3 constitute a parallel resonance circuit having a resonance frequency two or three times the transmission frequency of GSM/EGSM.

Capacitors Cg6, Cg2, Cg1 function not only as DC-cutting capacitors for removing a DC component and applying a control DC voltage to a circuit comprising diodes Dg1 and Dg2, but also as part of phase-adjusting circuits. A transmission line Lg2 is disposed between an anode of the diode Dg1 and the receiving terminal Rx-LB, the diode Dg2 is connected between one end of the transmission line Lg2 and the ground, and the capacitor Cg1 is connected between an anode of the diode Dg2 and the ground. A resistor Rg is connected in series between the anode of the diode Dg2 and a control terminal Vc. A capacitor Cvg connected between the control terminal Vc and the ground prevents noise from entering a control power supply, thereby stabilizing control. Any of transmission lines Lg1 and Lg2 is a λ/4 line, preferably having such length as to provide a resonance frequency within a frequency band of a transmission signal of GSM/EGSM. For instance, when their resonance frequencies are substantially equal to an intermediate frequency (869.5 MHz) of a transmission signal of GSM, excellent insertion loss characteristics can be obtained within the desired frequency band.

The second switch circuit SW2 (lower side in FIG. 3) switches a receiving terminal Rx-HB common to DCS and PCS, and a transmission terminal Tx-HB common to DCS and PCS. The second switch circuit SW2 comprises two diodes Dd1 and Dd2, and two transmission lines Ld1 and Ld2 as main elements. The diode Dd1 is disposed between the high-frequency filter of the diplexer circuit and the transmission terminal Tx-HB, an anode of the diode Dd1 being connected to the high-frequency filter of the diplexer circuit, and a cathode of the diode Dd1 being connected to an L-type lowpass filter LPF2 constituted by a transmission line LH5 and capacitors CH7, CH8. A transmission line Ld1 is connected between the other end of the transmission lines LH5 constituting the lowpass filter LPF2 and the ground. Because the lowpass filter LPF2 suppresses only high-order harmonic distortion contained in a transmission signal input from a power amplifier (not shown) on the side of DCS and PCS, it preferably passes a transmission signal of DCS or PCS, while sufficiently attenuating two times or more as large frequencies as that of the transmission signal of DCS or PCS. To secure isolation between the transmission terminal Tx-HB and the antenna terminal Ant, and between the transmission terminal Tx-HB and the receiving terminal Rx-HB when the diode Dd1 is in an OFF state, a series circuit of an inductor Ls and a capacitor Cs is connected in parallel to the diode Dd1 to cancel a capacitance component of the diode in an OFF state.

Any of transmission lines Ld1 and Ld2 is a λ/4 line, preferably having such length as to provide a resonance frequency within a frequency band of a transmission signal in the transmission/receiving system of DCS and PCS, particularly having such length that the resonance frequency is an intermediate frequency of the above frequency band. For instance, when the resonance frequency of the transmission lines Ld1 and Ld2 is substantially an intermediate frequency (1810 MHz) of transmission signals in the bands of DCS and PCS, excellent electric characteristics can be obtained in each mode, so that two transmission signals can be handled by one circuit. A capacitor Cd2 functions not only as a DC-cutting capacitor for removing a DC component and applying a control DC voltage to a circuit comprising diodes Dd1 and Dd2, but also as part of a phase-adjusting circuit. The transmission lines Ld2 has one end connected to the capacitor CH5 constituting the high-frequency filter of the diplexer circuit, and the other end connected to the grounded diode Dd2 and capacitor Cd1. An anode of the diode Dd2 is connected to a control terminal Vc via a resistor Rd. A capacitor Cvd stabilizes control by preventing noise from entering the control power supply. A capacitor Cd5 is a DC-cutting capacitor.

When overcurrent due to static electricity, thunderbolt, etc. flows through the antenna terminal, an inductor L1 permits the overcurrent to escape to the ground GND, thereby preventing the breakage of the module. An inductor L2 and Cg2, and an inductor L5 and Cd2 act as highpass, phase-adjusting circuits for adjusting a connection phase, thereby suppressing harmonics from leaking from the high-frequency amplifier circuit HPA. The relation with antenna-switch-side impedance is adjusted to be conjugated matching in a fundamental wave and non-conjugated matching in unnecessary n-th harmonics. L3, C2, L4 and C1 constitute an LC resonance circuit and an LC highpass circuit, with a resonance point near 250 MHz to attenuate electrostatic pulse, thereby preventing the electrostatic pulse from leaking to the downstream of the receiving terminal to protect a downstream bandpass filter. C3 is a matching-adjusting capacitor.

(C) High-Frequency Module

Figure 4:
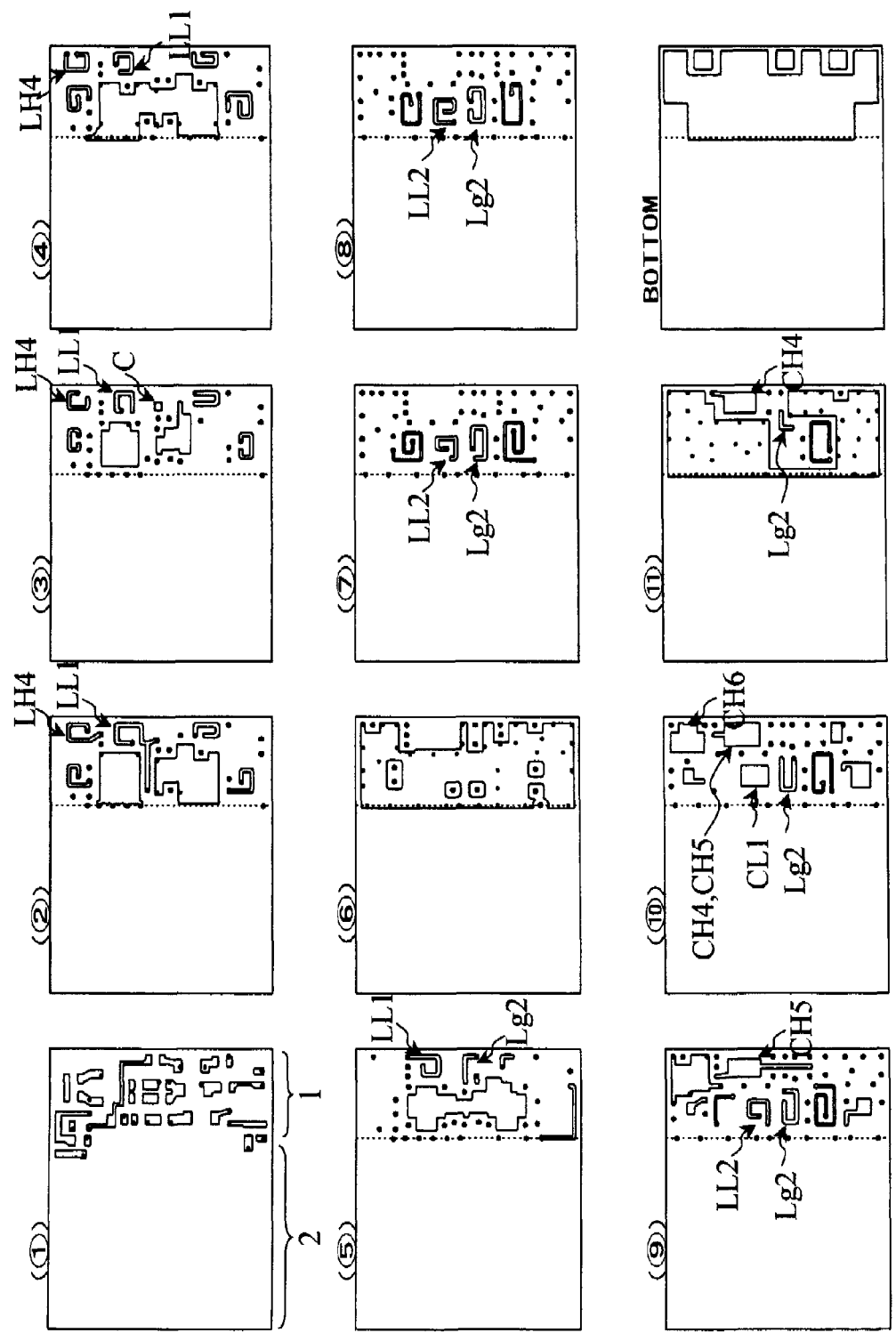
FIG. 4 is a partially developed view showing dielectric layers provided with electrode patterns for constituting the high-frequency module according to one embodiment of the present invention.

FIG. 4 shows a high-frequency module having the antenna switch circuit of FIG. 3 in a multilayer (11-layer) substrate. BOTTOM denotes a rear surface of the multilayer substrate. Each layer has a right-side region 1 of about ⅓ in width in which the antenna switch circuit is formed, and a left-side region 2 of about ⅔ in width in which a high-frequency amplifier circuit (not shown) is formed. The diplexer circuit has the structure shown in FIG. 2. The high-frequency amplifier circuit is connected, for instance, to the transmission terminal Tx-LB of GSM/EGSM in the antenna switch circuit to send the amplified transmission signal to the antenna switch circuit. It is preferable that the connection of the high-frequency amplifier and the antenna switch circuit is formed on upper-side layers, and that lines for the high-frequency amplifier and lines for the antenna switch circuit are formed on different layers without vertical overlap to avoid interference.

In FIG. 4, the same symbols are used on electrode patterns corresponding to the transmission lines and capacitors shown in FIGS. 2 and 3. The second capacitor CH4 and the third capacitor CH5 in the high-frequency filter of the diplexer circuit, and the first capacitor CL1 in the low-frequency filter are formed below the sixth dielectric layer provided with a ground electrode. Electrode patterns for the transmission line LL2 and the first capacitor CL1 constituting a series resonance circuit are formed with overlapping in a lamination direction. Similarly, electrode patterns for the transmission line LH4 and the fourth capacitor CH6 constituting a series resonance circuit are formed with overlapping in a lamination direction. Electrode patterns for the first transmission line LL1 in the low-frequency filter are formed on the second to fifth layers, so that a coil is constituted. Also, electrode patterns for the second transmission line Lg2 in the first switch circuit SW1 are formed on the fifth and seventh to eleventh layers, so that a coil is constituted.

An end of the electrode pattern of the first transmission line LL1 formed on the second layer is connected to an electrode pattern of a capacitor C formed on the third layer via a through-hole electrode. The electrode pattern of the capacitor C is opposing an end of the electrode pattern of the second transmission line Lg2 formed on the fifth layer, to constitute a capacitor. An end of the electrode pattern of the first transmission line LL1 formed on the second layer and an end of the electrode pattern of the second transmission line Lg2 formed on the seventh layer are connected to a capacitor Cg6 mounted on the uppermost layer, via through-hole electrodes. Such arrangement of electrode patterns provides a structure in which the capacitor C is connected in parallel to part of the first transmission line LL1 and part of the second transmission line Lg2. As described above, in the embodiment shown in FIG. 4, the electrode patterns constituting part of the first transmission line LL1, the electrode patterns constituting part of the second transmission line Lg2, and the electrode pattern of the capacitor C are overlapping in a lamination direction.

Example 1

The high-frequency module shown in FIG. 4 was produced by 11 dielectric green sheets made of LTCC sinterable at as low temperatures as 950° C. or lower. Each green sheet is preferably as thick as 40-200 μm such that transmission lines and capacitors are easily formed. The electrode patterns are preferably formed by a silver-based conductive paste. Each green sheet is provided with electrode patterns for transmission lines and capacitors and proper through-holes, laminated, pressure-bonded, and then sintered at 950° C. to obtain a laminate of about 10 mm×about 8 mm×about 0.65 mm. Diodes, transistors, chip inductors, chip capacitors, resistors, etc. are mounted on the laminate to obtain a high-frequency module. The high-frequency module is usually covered by a metal case (not shown) of about 1.6 mm in height. In place of the metal case, it may be sealed by a resin. The resin-sealed package is as high as about 1.5 mm.

Figure 5:
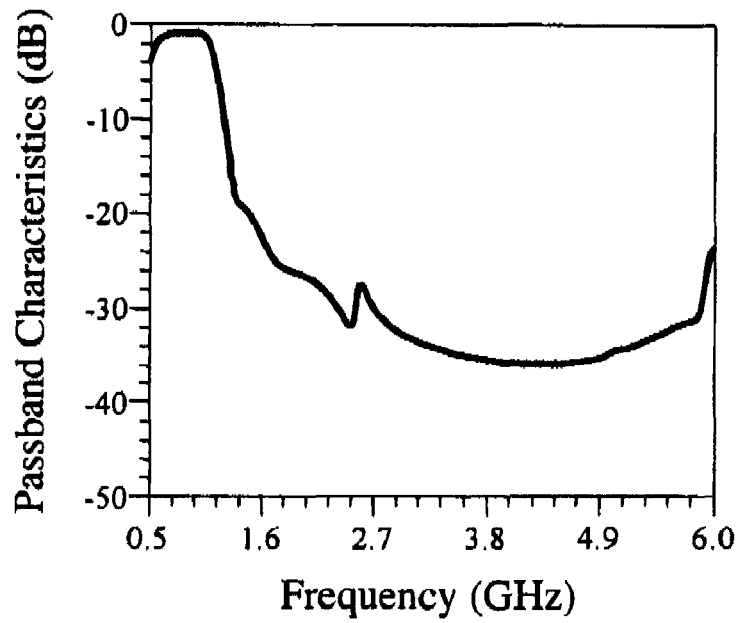
FIG. 5 is a graph showing the bandpass characteristics of the high-frequency module according to one embodiment of the present invention.
Figure 6:
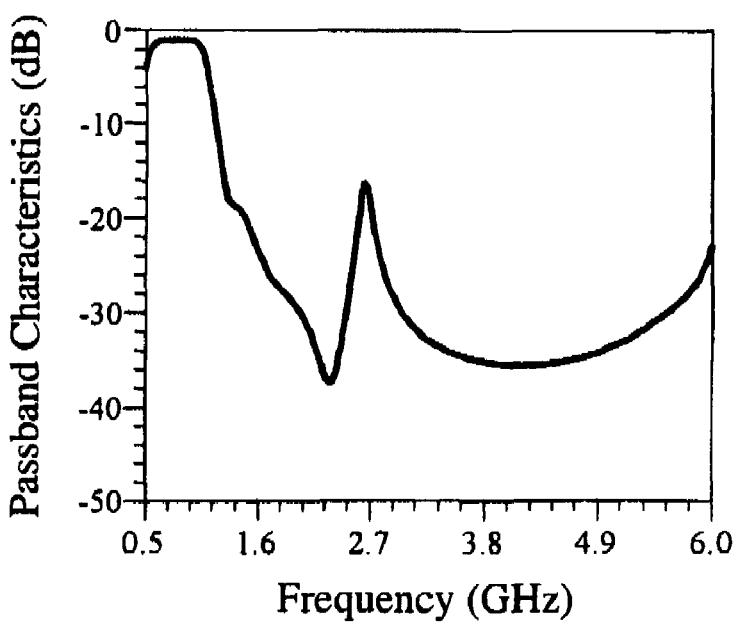
FIG. 6 is a graph showing the bandpass characteristics of the high-frequency switch module of Comparative Example.

FIG. 5 shows the bandpass characteristics of the high-frequency module of Example 1, and FIG. 6 shows the bandpass characteristics of a high-frequency module having a conventional circuit structure. In the conventional characteristics, there is a large peak of about −15 dB in an unnecessary band near 3 GHz, which may exceed about −10 dB depending on production variations. Accordingly, the conventional high-frequency module is likely to have defective receiving characteristics. On the other hand, the high-frequency module of Example 1 has about −25 dB or less near 3 GHz, free from adverse influence on receiving characteristics. Also, the high-frequency module of Example 1 had passband loss of about −1.0 dB, as low as that of the conventional high-frequency module comprising no capacitor for suppressing unnecessary waves.

[2] Second Embodiment (A) Diplexer Circuit

Figure 7:
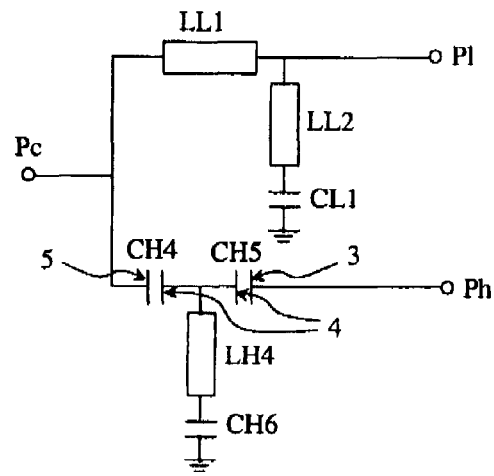
FIG. 7 is a view showing an equivalent circuit of the diplexer circuit according to another embodiment of the present invention.

FIG. 7 shows an equivalent circuit of the diplexer circuit according to the second embodiment of the present invention. The diplexer circuit passes a transmission signal from a high-frequency-side transmission circuit or a low-frequency-side transmission circuit during transmission, and branches received signals having different frequencies to a high-frequency-side receiving circuit or a low-frequency-side receiving circuit during reception. The diplexer circuit constituted by the low-frequency filter and the high-frequency filter as shown in FIG. 7 comprises a common terminal Pc, a low-frequency-side terminal P1 and a high-frequency-side terminal Ph. The high-frequency filter comprises a first capacitor CH4 connected to the common terminal Pc, a second capacitor CH5 connected between the first capacitor CH4 and the high-frequency-side terminal Ph, and a series resonance circuit connected between a connecting point of the first capacitor CH4 and the second capacitor CH5 and the ground and constituted by a first transmission line LH4 and a third capacitor CH6. The low-frequency filter comprises a second transmission line LL1 disposed between the low-frequency-side terminal P1 and the common terminal Pc, and a series resonance circuit comprising a third transmission line LL2 having one end connected between the second transmission line LL1 and the low-frequency-side terminal P1 and the other end grounded, and a fourth capacitor CL1. The circuit structure such as a lowpass filter, etc. in the diplexer circuit are not restricted to the above, but may be properly modified.

Figure 8:
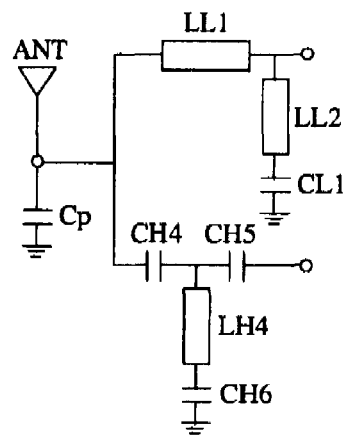
FIG. 8 is a view showing parasitic capacitance in an equivalent circuit of the diplexer circuit according to another embodiment of the present invention.
Figure 9:
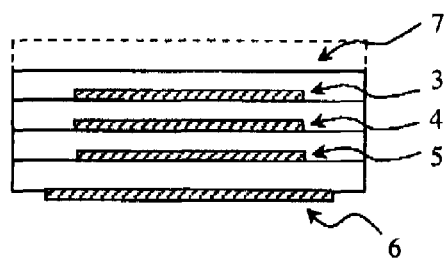
FIG. 9 is a schematic cross-sectional view showing part of the high-frequency module laminate according to another embodiment of the present invention.

The first transmission line LH4, the first capacitor CH4, the second capacitor CH5 and the third capacitor CH6 in the diplexer circuit are constituted by electrode patterns formed on dielectric layers constituting a laminate. In the laminate comprising dielectric layers 7, as shown in FIG. 9, one of the opposing electrodes constituting the first capacitor CH4 is an electrode 5 connected to the common terminal Pc, which is opposing the ground electrode. Thus, parasitic capacitance can be generated using an electrode for a capacitor, part of the diplexer circuit. In the structure shown in FIG. 9, the electrode 5 constituting the first capacitor CH4 and a ground electrode 6 are opposing on both sides of one dielectric layer. The parasitic capacitance can be easily adjusted by the thickness of a dielectric layer, the area of the ground electrode 6, and/or the dielectric constant of a dielectric layer. A common electrode 4 acting as the other electrode of the first capacitor CH4 and an electrode (on the side of the first capacitor CH4) of the second capacitor CH5 are formed above the electrode 5 in the laminate. The other electrode 3 (connected to the high-frequency-side terminal Ph) of the second capacitor CH5 is formed above the common electrode 4. Thus, the electrode 5 and the common electrode 4 constitute the first capacitor CH4, and the common electrode 4 and the electrode 3 constitute the second capacitor CH5, with parasitic capacitance generated with the ground electrode 6 as an opposing electrode. Although parasitic capacitance is conventionally minimized in a highpass filter (for instance, JP 2002-26677 A), the present invention positively utilizes parasitic capacitance to suppress harmonics. When a diplexer circuit is used in an antenna switch module, as shown in FIG. 8, parasitic capacitance Cp is attached to the antenna, thereby suppressing harmonics.

(B) High-Frequency Circuit

Figure 10:
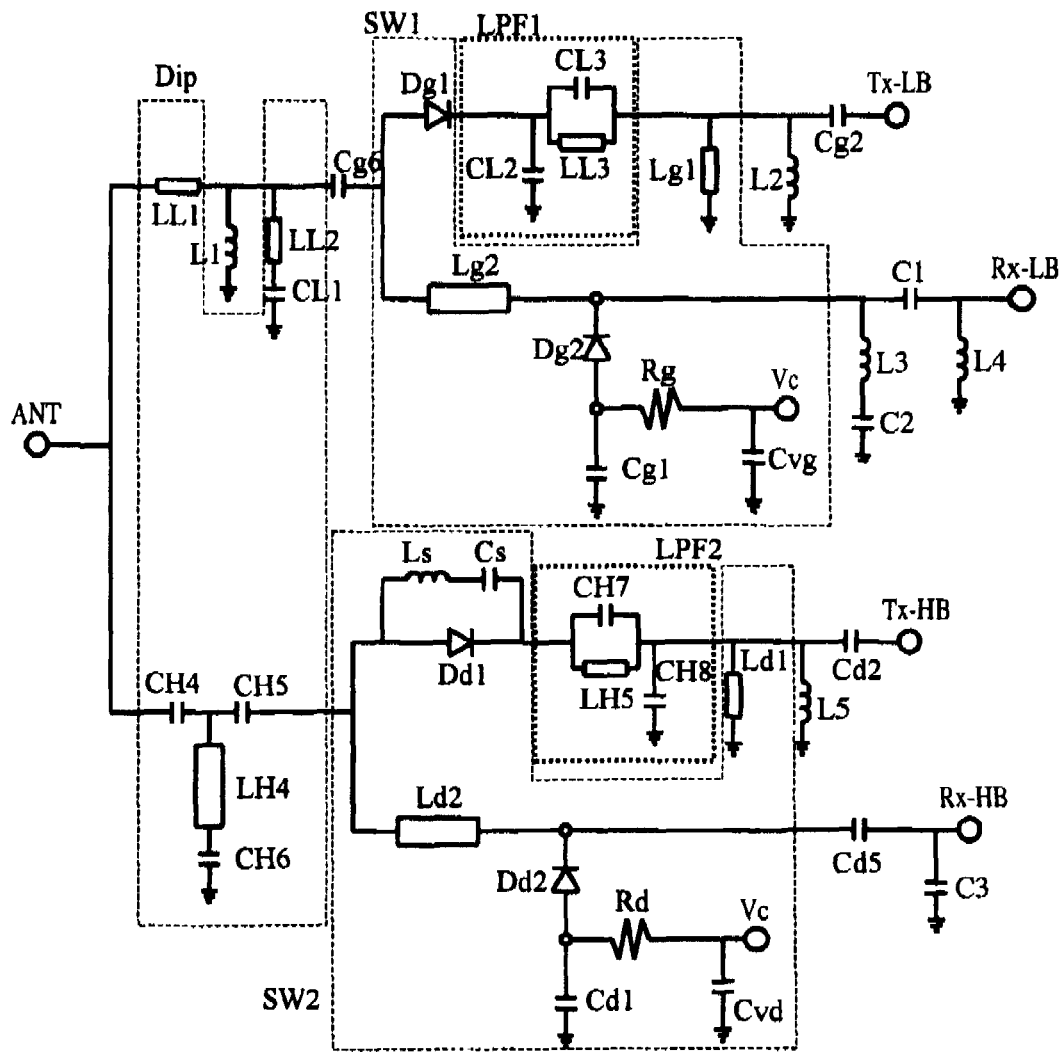
FIG. 10 is a view showing an equivalent circuit of the quadband antenna switch circuit according to a further embodiment of the present invention.
Figure 11:
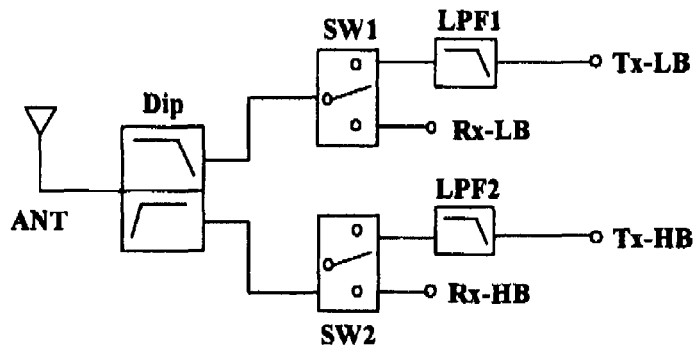
FIG. 11 is a block diagram showing the high-frequency module according to a still further embodiment of the present invention.

The high-frequency circuit comprising the above diplexer circuit comprises a first switch circuit for switching a transmission system and a receiving system in the first frequency band on the low-frequency side of the diplexer circuit, and a second switch circuit for switching a transmission system and a receiving system in the second frequency band on the high-frequency side of the diplexer circuit. As an equivalent circuit of the high-frequency circuit in this embodiment, FIG. 10 shows an equivalent circuit of the quadband antenna switch circuit using a GSM850 band (transmission frequency: 824-849 MHz, and receiving frequency: 869-894 MHz) and an EGSM band (transmission frequency: 880-915 MHz, and receiving frequency: 925-960 MHz) as low-frequency bands, and a DCS band (transmission frequency: 1710-1785 MHz, and receiving frequency: 1805-1880 MHz) and a PCS band (transmission frequency: 1850-1910 MHz, and receiving frequency: 1930-1990 MHz) as high-frequency bands, and FIG. 11 shows its block diagram. Because this equivalent circuit is the same as in the first embodiment except for using the diplexer circuit in the second embodiment, its explanation will be omitted.

(C) High-Frequency Module

Figure 12:
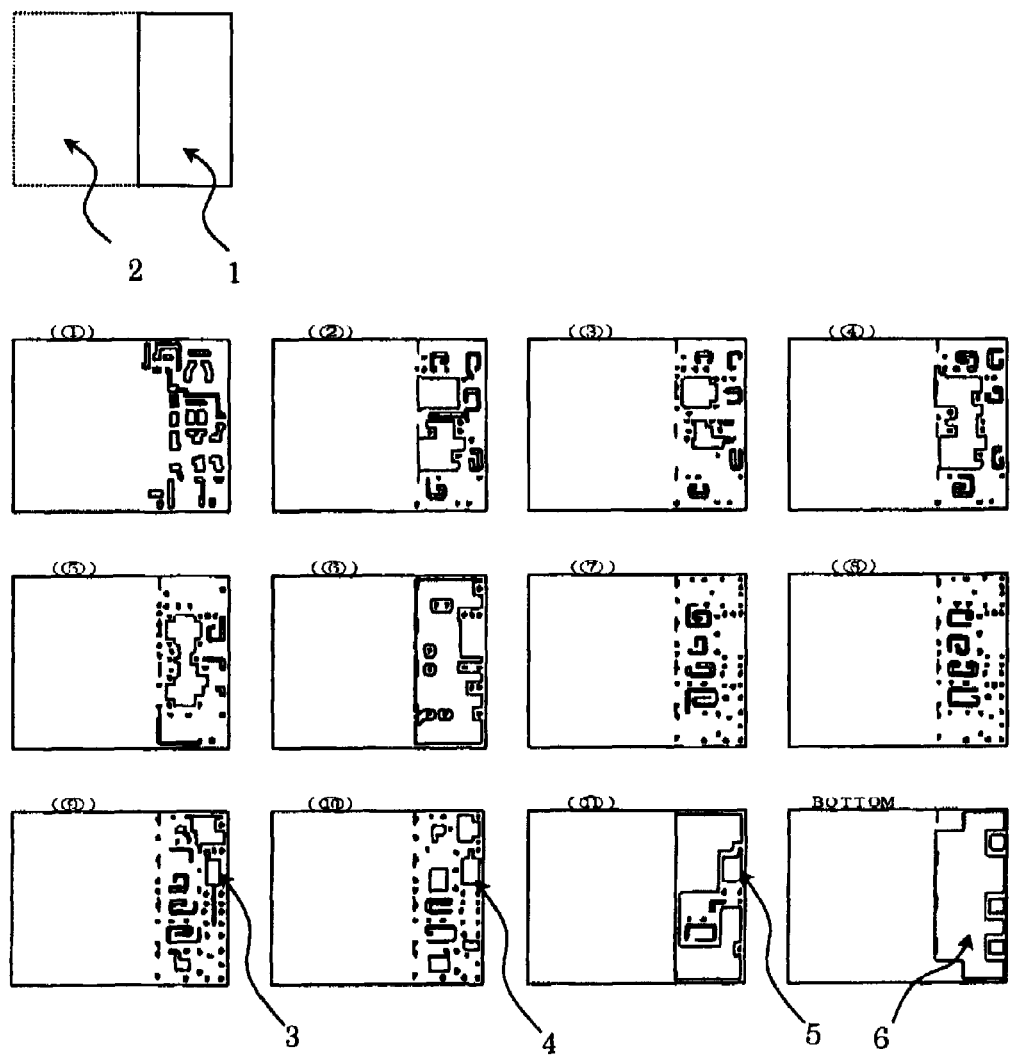
FIG. 12 is a partially developed view showing dielectric layers provided with electrode patterns for constituting the high-frequency module according to a still further embodiment of the present invention.

FIG. 12 shows a high-frequency switch module in which the antenna switch circuit shown in FIG. 10 is formed in a multilayer substrate. The sixth layer is provided with a ground electrode substantially on its entire surface except for a region in which through-hole electrodes are formed. The first and second capacitors CH4, CH5 in the high-frequency filter of the diplexer circuit are formed below the sixth layer provided with a ground electrode. Specifically, an electrode 3 (on the side of the high-frequency-side terminal Ph) for the second capacitor CH5 is formed on the ninth layer, a common electrode 4 for the first and second capacitors CH4, CH5 is formed on the tenth layer, and an electrode 5 (on the side of the common terminal Pc) for the first capacitor CH4 is formed on the 11-th layer, the electrode 5 being opposing a ground electrode formed on a rear surface of the laminate. The electrodes 3, 4 and 5 themselves are also opposing. Although parasitic capacitance is generated by using as an opposing electrode a ground electrode formed on the rear surface in this Example, this is not restrictive, and a ground electrode in the laminate may be used.

When discrete parts such as chip capacitors, chip inductors, etc. are used in the diplexer circuit, parasitic capacitance may be generated by forming a ground electrode immediately below or around mounting pads having the same potential as the antenna terminal (common terminal Pc). To add parasitic capacitance to the antenna terminal, the antenna terminal may be disconnected from the diplexer. In any case, parasitic capacitance is preferably controlled to about 1 pF or less by adjusting electrode gaps, etc., because too much parasitic capacitance increases insertion loss.

Example 2

A laminate module having the structure shown in FIG. 12 was produced as an antenna switch module. The laminate module shown in FIG. 12 was also provided with a high-frequency amplifier. The laminate module comprised first to eleventh dielectric green sheets, BOTTOM denoting a rear surface of the laminate. Dielectric green sheets used in this Example are made of LTCC sinterable at as low temperatures as 950° C. or lower. The size and production method of the laminate are the same as in Example 1.

Comparing the diplexer circuit of Example 2 with a conventional diplexer circuit in which an electrode (connected to the common terminal Pc) for the first capacitor CH4 was not opposing a ground electrode, it was found that although they were substantially equal with respect to insertion loss, the former had attenuation improved as much as about 1.5-7 dB on the low-frequency side (GSM and EGSM) and about 1.5-3 dB on the high-frequency side (DCS and PCS).

The laminate module shown in FIG. 12 was produced as a high-frequency switch module having the diplexer circuit of Example 2. With a dielectric layer for forming a main capacitor in the diplexer circuit set as thick as 25 μm, and with the distance of 100 μm between the opposing electrode of the first capacitor CH4 and the ground electrode on the rear surface, parasitic capacitance in the laminate module was adjusted to about 0.5 pF. Comparing the high-frequency switch module of Example 2 with a high-frequency switch module having the conventional diplexer circuit, it was found that although they were equal with respect to insertion loss, the former had attenuation improved as much as about 2-7 dB on the low-frequency side and about 1.5-14 dB on the high-frequency side (DCS and PCS).

[3] Third Embodiment

The high-frequency module in the third embodiment is the same as in the first embodiment except for the arrangement of transmission lines LL1, LL2, LH4, Lg1, Lg2, Ld2 in the diplexer circuit Dip and the first and second switch circuits. Harmonics in the second frequency band pass a transmission line Ld1. Signals on the low-frequency side of the first frequency band pass transmission lines LL1, LH4 and Lg2, and signals on the high-frequency side of the second frequency band pass transmission lines LL2, Lg1 and Ld2. High-frequency components leaking to a low-frequency-side circuit pass the transmission lines LL2, Lg1, which are circuit elements on the low-frequency side, and low-frequency components leaking to a high-frequency-side circuit pass the transmission line LH4, which is a circuit element on the low-frequency side.

To suppress interference between transmission and receiving circuits in the first frequency band (GSM850 and EGSM) and those in the second frequency band (DCS and PCS), transmission lines LL1, LH4, Lg2 through which signals in the first frequency band pass are formed on one lamination-direction side of the ground electrode in the laminate, and transmission lines LL2, Lg1, Ld2 through which signals in the second frequency band pass are formed on the other lamination-direction side of the above ground electrode. Namely, the above transmission lines are separated by the ground electrode in a lamination direction. Because the second harmonics of the first frequency band of GSM850 and EGSM are substantially the same as the second frequency band of DCS and PCS, the second harmonics of the first frequency band have great influence on the second frequency band. In such relation between the first frequency band the second frequency band, the above structure is particularly effective. A ground electrode need only be formed on a dielectric layer to separate the transmission lines through which signals in the first frequency band pass from the transmission lines through which signals in the second frequency band pass at least partially, but it is preferably wider than both transmission lines on the dielectric layer for complete separation. Other ground electrodes may be formed between electrode patterns of transmission lines through which signals in the first frequency band pass, and between electrode patterns of transmission lines through which signals in the second frequency band pass. Ground electrodes formed on pluralities of layers are preferably connected via through-hole electrodes, whose number is preferably as many as possible.

Figure 13:
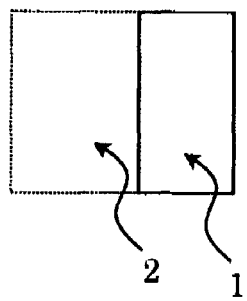
FIG. 13 is a partially developed view showing dielectric layers provided with electrode patterns for constituting a still further high-frequency switch module of the present invention.
Figure 13:
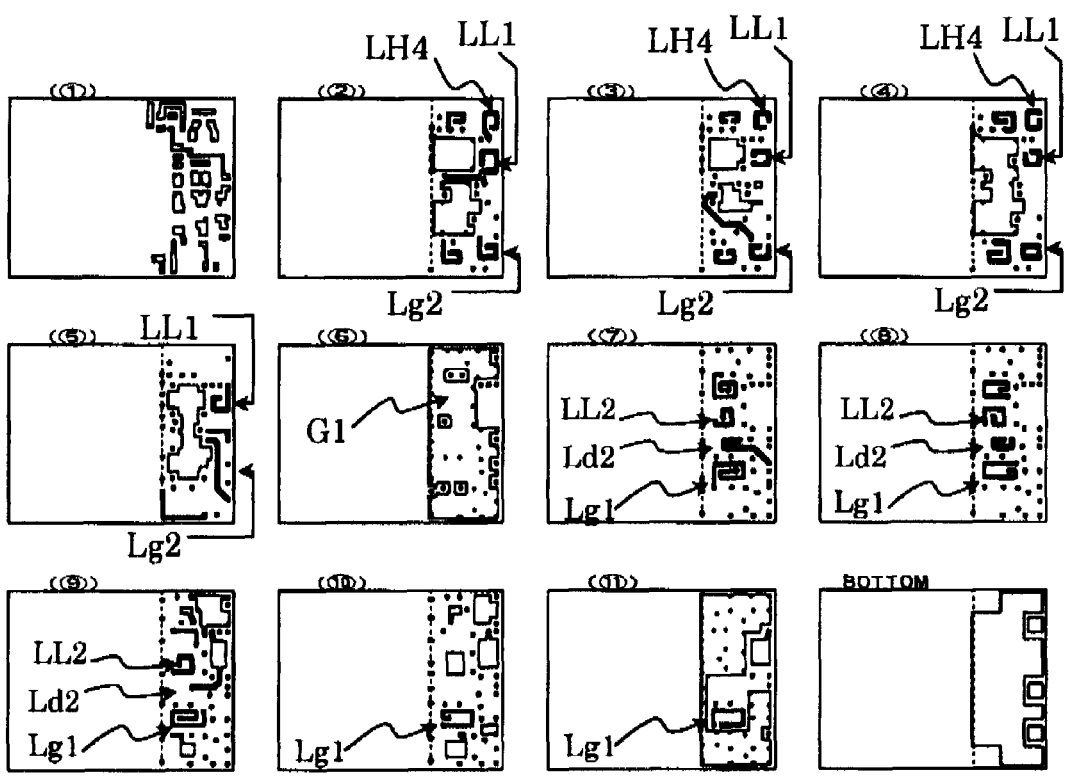

FIG. 13 shows a high-frequency module having the antenna switch circuit shown in FIG. 10 in a laminate. In each layer, the antenna switch circuit is formed in a right-side region 1 of about ⅓ in width, and the high-frequency amplifier circuit is formed in a left-side region 2 of about ⅔ in width. The high-frequency amplifier circuit is connected to the transmission terminal Tx-LB of GSM/EGSM, for instance, in the antenna switch circuit shown in FIG. 10, to send the amplified transmission signal to the antenna switch circuit. It is preferable that the connection of the high-frequency amplifier and the antenna switch circuit is formed on upper-side layers, and that lines for the high-frequency amplifier and those for the antenna switch circuit are formed on different layers without vertical overlap to avoid interference.

FIG. 13 shows 11 dielectric layers provided with electrode patterns and a rear surface BOTTOM of the laminate from upper left. A ground electrode is formed substantially entirely on the sixth layer except for a region in which through-hole electrodes are formed. Electrode patterns for transmission lines LL1, LH4, Lg2 through which signals in the first frequency band pass are formed on the second to fifth layers above the sixth layer provided with the ground electrode, and electrode patterns for transmission lines LL2, Ld2, Lg1 through which signals in the second frequency band pass are formed on the seventh to eleventh layers below the sixth layer provided with the ground electrode. Among the electrode patterns for transmission lines and capacitors constituting the lowpass filters LPF1, LPF2 used in transmission and receiving systems in the first and second frequency bands, the electrode patterns of the transmission lines are formed above the ground electrode, and the electrode patterns of the capacitors are formed below the ground electrode.

Example 3

The laminate module shown in FIG. 13 was produced as an antenna switch module. 11 dielectric green sheets made of LTCC sinterable at as low temperatures as 950° C. or lower were laminated under the same conditions as in the first embodiment. In all layers constituting the laminate module, electrode patterns constituting the antenna switch circuit were formed in a right-side region 1, and electrode patterns constituting the high-frequency amplifier were formed in a left-side region 2.

Comparing the high-frequency module of Example 3 with a conventional high-frequency module in which transmission lines for signals in the first frequency band transmission lines for signals in the second frequency band were not separated in a lamination direction, it was found that on the transmission side, the former had insertion loss improved as much as about 0.1-0.2 dB on the low-frequency side (GSM and EGSM) and about 0.05-0.2 dB on the high-frequency side (DCS and PCS), and attenuation improved as much as about 3-12 dB on the low-frequency side and about 5-15 dB on the high-frequency side (DCS and PCS). It was also found that on the receiving side, the former had insertion loss improved as much as about 0.05-0.1 dB on the low-frequency side (GSM and EGSM) and about 0.1-0.3 dB on the high-frequency side (DCS and PCS). Because the leakage of radio waves increases as the frequency becomes higher, the effects of the present invention are remarkable at high frequencies.

The deterioration of characteristics in unnecessary bands due to interference was also eliminated. This effect was confirmed clearly from receiving isolation characteristics (bandpass characteristics between the low-frequency-side receiving terminal and the high-frequency-side receiving terminal). The isolation-improving effect was about 5 dB in the low-frequency band about 2 dB in the high-frequency band, and about 3-20 dB in each n-th harmonic band. Such improvement in insertion loss and attenuation appears to be obtained by shielding between the low-frequency side and the high-frequency side. In the case of using a GaAs switch, the same effect can be obtained by separating low-frequency-side lines from high-frequency-side lines by the ground electrode.

[4] Fourth Embodiment

Figure 14:
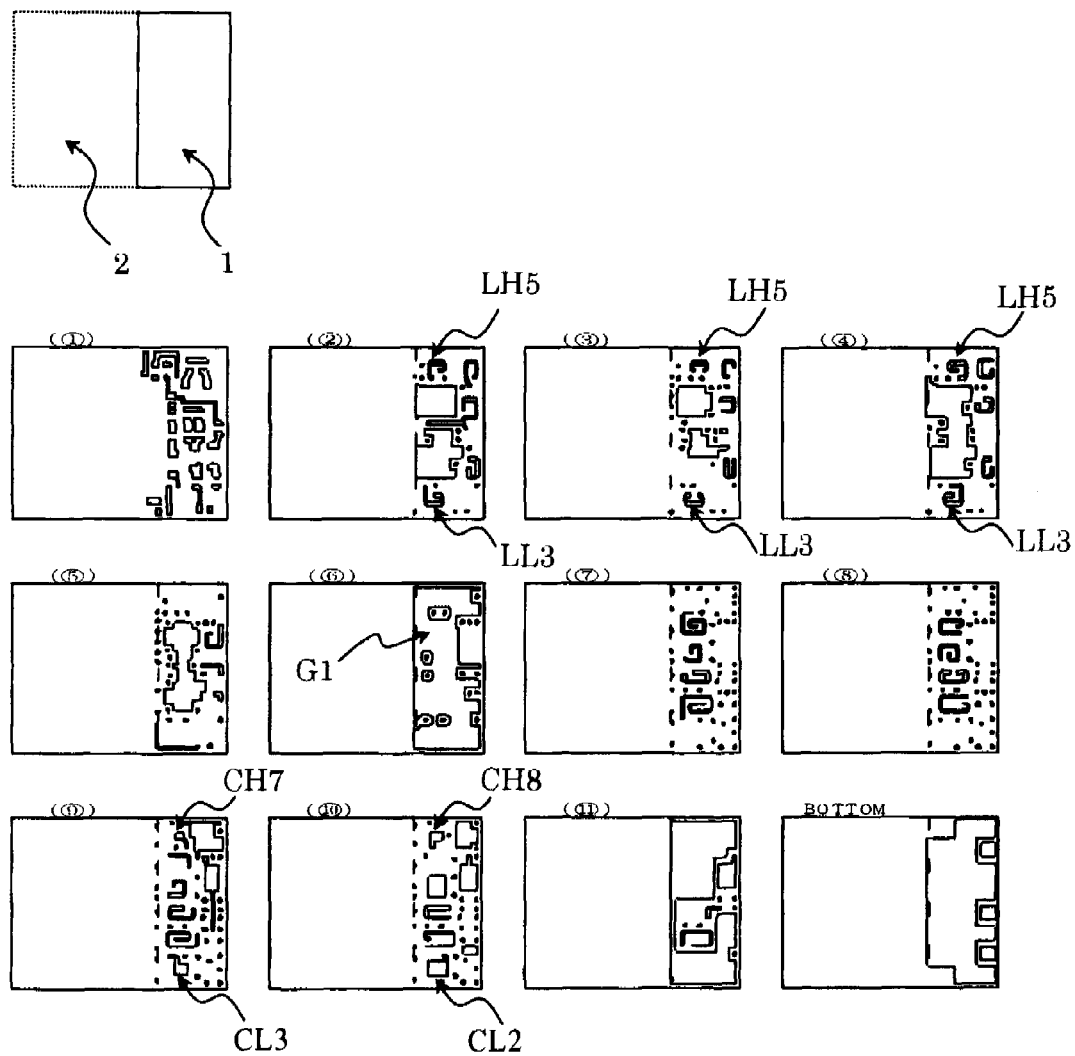
FIG. 14 is a partially developed view showing dielectric layers provided with electrode patterns for constituting the laminated high-frequency module comprising the lowpass filter according to one embodiment of the present invention.

A lowpass filter suitable for the high-frequency circuit and module of the present invention will be explained in detail below. FIG. 10 shows one example of equivalent circuits of the quadband antenna switch circuit covering the low-frequency band of GSM and EGSM and the high-frequency band of DCS and PCS, and FIG. 14 shows electrode patterns on dielectric layers constituting the laminate comprising a lowpass filter. Because portions of the antenna switch circuit other than the lowpass filter are the same as in the first embodiment, their explanation will be omitted.

The lowpass filter may be a discrete laminated lowpass filter. Though not particularly restricted, the structure of the laminate module comprising a lowpass filter is preferably an antenna switch module, or a composite module comprising an antenna switch circuit and a high-frequency amplifier circuit.

Figure 15:
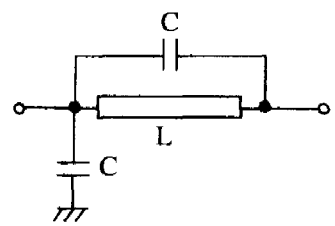
FIG. 15 is a view showing an equivalent circuit of the lowpass filter according to one embodiment of the present invention.
Figure 16:
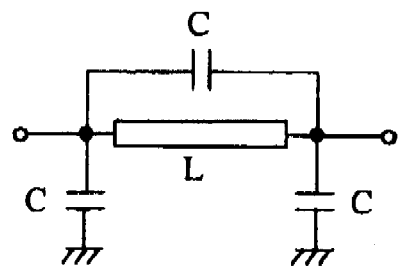
FIG. 16 is a view showing an equivalent circuit of the lowpass filter according to another embodiment of the present invention.

The first and second lowpass filters LPF1, LPF2 shown in FIGS. 10 and 11 may have the same structure. FIG. 15 shows an equivalent circuit of the lowpass filter LPF (LPF1 or LPF2). The first lowpass filter LPF1 is an L-type lowpass filter constituted by an inductance-generating transmission line LL3 and capacitors CL2, CL3. The capacitor CL3 is connected in parallel to the transmission line LL3 to constitute a parallel resonance circuit. The lowpass filter is not restricted to the structure shown in FIG. 15, but may be, for instance, a π-type lowpass filter shown in FIG. 16.

Referring to FIG. 14 showing 11 dielectric layers provided with electrode patterns and a rear surface BOTTOM of the laminate, the first lowpass filter LPF1 in the laminate will be explained. FIG. 14 shows the first to eleventh layers and a rear surface from upper left. Electrode patterns forming a transmission line LL3 and capacitors CL2, CL3 constituting the lowpass filter LPF1 are denoted by LL3, CL2 and CL3. A ground electrode G1 is formed on the sixth layer, and transmission line electrode patterns LL3 are formed on the second to fifth layers above the ground electrode G1. Capacitor electrode patterns CL2, CL3 are formed on the ninth to eleventh layers below the ground electrode G1. Thus, pluralities of capacitor electrode patterns CL2, CL3 for the first lowpass filter LPF1 are separated from the transmission line electrode patterns LL3 by the ground electrode G1 in a lamination direction. Both electrodes patterns are preferably separated over the entire surface by the ground electrode G1. In a case where the lowpass filter has pluralities of transmission lines, too, electrode patterns constituting pluralities of transmission lines are formed on one side of the ground electrode in a lamination direction.

To miniaturize the laminate, the transmission line electrode patterns LL3 and the capacitor electrode patterns CL2, CL3 are overlapping in a lamination direction in the structure shown in FIG. 14. Because transmission lines and capacitors are separated by the ground electrode in the lowpass filter of the present invention, there is no interference even if an inductor and a capacitor are overlapping in a lamination direction. Because the first layer, etc. outside the transmission line LL3 are not provided with a ground electrode overlapping the transmission line electrode patterns LL3 in a lamination direction, it is possible to avoid the generation of parasitic capacitance and increase in insertion loss, which occur when an opposing ground electrode is formed outside the transmission line LL3.

In the structure shown in FIG. 14, a ground electrode (opposing ground electrode of the capacitor CL2) different from the ground electrode G1 is formed on the side of the capacitor electrode patterns CL2, CL3. In this case, the ground electrode G1 sandwiched by the transmission line electrode patterns LL3 and the capacitor electrode patterns CL2, CL3 may not function as a ground electrode opposing the capacitors CL2, CL3. The ground electrode G1 sandwiched by the transmission line electrode patterns LL3 and the capacitor electrode patterns CL2, CL3 and a ground electrode opposing the capacitors CL2, CL3 may be integrated into a single ground electrode. In this case, a ground electrode different from the ground electrode G1 is not formed outside the capacitor electrode patterns CL2, CL3. This structure is advantageous in miniaturization.

Although inductance electrode patterns are not completely separated from capacitor electrode patterns in the lowpass filter of JP 11-27177 A because a ground electrode is partially formed between the inductance and the capacitor, there is a ground electrode between inductance electrode patterns and capacitor electrode patterns in the lowpass filter in this embodiment. In this respect, both lowpass filters are greatly different. Further, because another opposing ground electrode is not formed outside the transmission line electrode patterns, the generation of parasitic capacitance acting as inductance is suppressed in transmission lines, contributing to the reduction of loss.

Figure 17A:
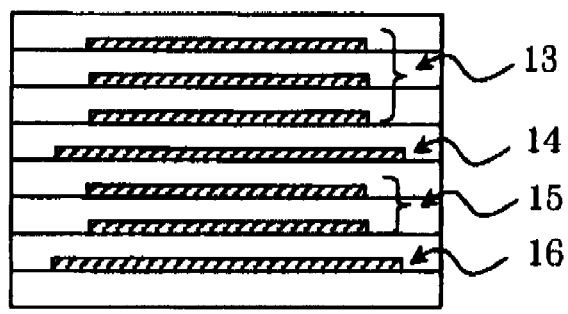
FIG. 17(*a*) is a schematic cross-sectional view showing one example of the lowpass filter used in the present invention.

In the lowpass filter shown in FIG. 17(a), a ground electrode 14 is formed between electrode patterns 13 for inductance-constituting transmission lines and capacitor electrode patterns 15 in a lamination direction, and a ground electrode 16 is formed below the capacitor electrode patterns 15. Because of a larger area than those of the transmission line electrode patterns 13 and the capacitor electrode patterns 15 formed above and below, the ground electrode 14 exists in an entire region opposing the transmission line electrode patterns 13 and the capacitor electrode patterns 15 in a lamination direction, so that the ground electrode 14 prevents interference between transmission lines and a capacitor.

Because of no ground electrode above the transmission line electrode patterns 13, there is no parasitic capacitance above the transmission lines. In this case, the distance between the inductance-constituting transmission lines and the ground electrode can be increased as long as an impedance design permits, to suppress parasitic capacitance generated below the transmission lines, thereby reducing the insertion loss. When the ground electrode 14 is not used as one of opposing capacitor electrodes, the distance between a transmission line electrode pattern on the side of the ground electrode 14 and the ground electrode is preferably increased to suppress parasitic capacitance. When the ground electrode 14 is used as one of opposing capacitor electrodes, this is not true.

Figure 17B:
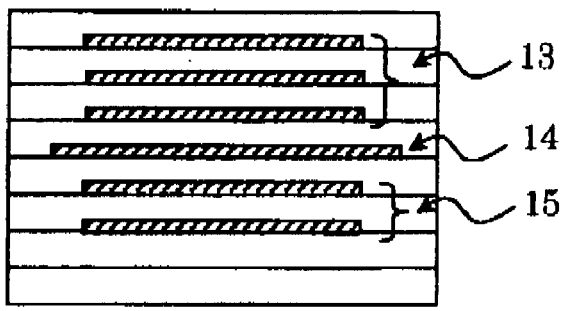

In the structure shown in FIG. 17(b), a ground electrode 14 is formed between electrode patterns 13 for an inductor-constituting transmission line and capacitor electrode patterns 15 in a lamination direction, but another ground electrode is not formed below the capacitor electrode patterns 15. Accordingly, the ground electrode 14 is used as an opposing electrode for the capacitor. This structure also provides the same effects as those shown in FIG. 17(a). In this structure, because the ground electrode 14 is used as one of opposing electrodes, the distance between the electrode patterns 15 and the ground electrode 14 is preferably 50 µm or less.

The second lowpass filter shown in FIG. 10 can be constituted like the first lowpass filter. When the laminate module comprises pluralities of lowpass filters, the formation of ground electrodes in pluralities of lowpass filters on the same dielectric layer is not necessarily required, though it is preferable. Such structure is effective for the miniaturization of a laminate and the suppression of unnecessary floating capacitance.

The above lowpass filter can be used in any antenna switch circuit in the first to third embodiments, and not only in the high-frequency modules in the first and second embodiments but also in other multiband high-frequency modules.

Example 4

The laminate module shown in FIG. 14 was produced as an antenna switch module by 11 dielectric green sheets made of LTCC sinterable at as low temperatures as 950° C. or lower. This laminate module has a high-frequency amplifier, too. The size and production method of the laminate are the same as in the first embodiment.

Comparing the lowpass filter of Example 4 with a conventional lowpass filter having a ground electrode above an inductance-constituting transmission line, it was found that the former had insertion loss improved as much as about 0.3-0.35 dB on the low-frequency side (GSM and EGSM) and about 0.2-0.3 dB on the high-frequency side (DCS and PCS), and attenuation improved as much as about 2-5 dB on the low-frequency side (GSM and EGSM) and about 4-10 dB on the high-frequency side (DCS and PCS). This is because the inductance-constituting transmission line had such reduced parasitic capacitance that it was shorter than the conventional design. The same improvement was obtained when a lowpass filter was added to the high-frequency switch module.

Because large parasitic capacitance of the transmission line deteriorates its insertion loss, the distance between transmission line electrodes and a ground electrode is preferably as large as possible; it was adjusted to 100 µm in the produced laminate module. On the other hand, in the produced circuit structure, large parasitic capacitance on the capacitor side makes it difficult to design the impedance to 50Ω and thus have matching between the lowpass filter and other circuits. Accordingly, the distance between capacitor electrodes and a ground electrode is preferably as large as possible; it was adjusted to 225 µm in the produced laminate module.

Comparing the lowpass filter of Example 4 with a conventional lowpass filter having no intermediate ground electrode, it was found that the former had insertion loss improved as much as about 0.2-0.3 dB on the low-frequency side (GSM and EGSM) and about 0.2-0.3 dB on the high-frequency side (DCS and PCS), and attenuation improved as much as about 5-8 dB on the low-frequency side (GSM and EGSM) and about 5-12 dB on the high-frequency side (DCS and PCS). While the conventional lowpass filter had no clear attenuation pole on both low-frequency and high-frequency sides, making its designing difficult, the lowpass filter of the present invention clearly had designed attenuation poles without suffering the deterioration of characteristics in unnecessary bands due to interference. Thus the designing to obtain desired characteristics was easy, reducing the designing time. In the case of a high-frequency switch module, the same improvement was obtained.

When a ground electrode intermediately arranged in the lowpass filter of the present invention was used as a grounded opposing electrode in the lowpass filter, various characteristics were improved like above, making it possible to reduce the thickness of the laminate by about 100 µm for miniaturization. Of course, this effect can also be obtained in the case of a laminate module.

The first and second switch circuits SW1, SW2 may be GaAs switches, for instance, single-pole, double-throw (SPDT) switches in any embodiments, unless transmission lines are indispensable for the switch circuits. The use of a GaAs switch reduces transmission lines used in the switch. The diplexer circuit in the high-frequency circuit is not restricted to the depicted position. For instance, with a common terminal of the switch circuits SW1, SW2 connected to the antenna ANT, the diplexer circuit may be connected to the transmission and receiving terminals of the switch circuits. Other circuits may be disposed between the antenna ANT and the diplexer circuit. Further, the diplexer circuit may be replaced by an SPnT switch, wherein n is a natural number of 2 or more, to conduct the switching of frequency bands and the switching of transmission and reception.

The present invention is not restricted to the above embodiments, but may be applied to various multiband high-frequency modules.

The dielectric layer used in the high-frequency module of the present invention may be formed by ceramics or resins. When the resins are used for a substrate, elements that cannot be constituted by electrode patterns formed in a multilayer substrate, such as capacitors, etc. may be chip elements mounted on the substrate.

EFFECT OF THE INVENTION

Because the diplexer of the present invention comprises a low-frequency filter comprising a first transmission line series-connected to a low-frequency-side path and a capacitor parallel-connected to part of the first transmission line, it can effectively suppress unnecessary bands with low loss despite its small size. The high-frequency module of the present invention can also be small, and suppress the leakage and interference of signals in transmission and receiving systems having different frequency bands.

What is claimed is:

1. A diplexer circuit comprising
a common terminal,
a low-frequency-side terminal,
a high-frequency-side terminal,
a low-frequency-side path comprising a low-frequency filter disposed between said common terminal and said low-frequency-side terminal, and
a high-frequency-side path comprising a high-frequency filter disposed between said common terminal and said high-frequency-side terminal,
said low-frequency filter comprising a first transmission line series-connected to said low-frequency-side path, and a capacitor for suppressing unnecessary waves parallel-connected to a portion of said first transmission line less than an entire portion of said first transmission line.

2. The diplexer circuit according to claim 1, wherein said capacitor is parallel-connected to said portion of said first transmission line less than said entire portion of said first transmission line on the side of said low-frequency-side terminal to constitute a parallel resonance circuit, and a remaining portion of said first transmission line less than said entire portion of said first transmission line constitutes an inductance element.

3. A high-frequency circuit comprising the diplexer circuit recited in claim 1, which further comprises a second transmission line connected to said low-frequency-side terminal, said capacitor being parallel-connected to part of said first transmission line and at least part of said second transmission line.

4. The high-frequency circuit according to claim 3, further comprising a switch circuit connected to said low-frequency-side terminal for switching a transmission-side path and a receiving-side path in said low-frequency-side path, said second transmission line being a transmission line disposed in the receiving-side path of said switch circuit.

5. A high-frequency module having the high-frequency circuit recited in claim 3, which is formed in a multilayer substrate comprising dielectric layers provided with electrode patterns.

6. The high-frequency module according to claim 5, wherein electrode patterns constituting part of said first transmission line, electrode patterns constituting at least part of said second transmission line, and said capacitor electrode patterns are overlapping in the laminate in a lamination direction.

7. A high-frequency module having the diplexer circuit recited in claim 1, which is formed in a multilayer substrate comprising dielectric layers provided with electrode patterns.

8. A diplexer circuit comprising a common terminal, a low-frequency-side terminal, a high-frequency-side terminal, a low-frequency-side path comprising a low-frequency filter disposed between said common terminal and said low-frequency-side terminal, and a high-frequency-side path comprising a high-frequency filter disposed between said common terminal and said high-frequency-side terminal, parasitic capacitance generated on the side of said common terminal being used as a capacitor for suppressing harmonics.

9. The diplexer circuit according to claim 8, wherein said high-frequency filter comprises a first capacitor connected to said common terminal, said parasitic capacitance being generated on the common terminal side of said first capacitor.

10. The diplexer circuit according to claim 9, wherein one of opposing electrodes constituting said first capacitor, which is connected to said common terminal, is opposing a ground electrode, thereby generating said parasitic capacitance between both electrodes.

11. The diplexer circuit according to claim 9, wherein said high-frequency filter comprises a first capacitor connected to said common terminal, a second capacitor connected between said first capacitor and said high-frequency-side terminal, and a series resonance circuit comprising a third transmission line and a third capacitor between a connecting point of said first capacitor and said second capacitor and the ground, said third transmission line and said first to third capacitors being formed in a laminate comprising dielectric layers provided with electrode patterns, and one of opposing electrodes constituting said first capacitor in said laminate, which is connected to said common terminal, being opposing a ground electrode.

12. A high-frequency module having the diplexer circuit recited in claim 8, which is formed in a multilayer substrate comprising dielectric layers provided with electrode patterns.

13. The high-frequency module according to claim 12, comprising a first switch circuit for switching a transmission system and a receiving system in the first frequency band branched by said diplexer circuit, and a second switch circuit for switching a transmission system and a receiving system in the second frequency band branched by said diplexer circuit.

14. A high-frequency module for use in a multiband wireless communications apparatus selectively using at least a first frequency band and a second frequency band higher than said first frequency band, the high-frequency module comprising:
a diplexer circuit for branching a first transmission/receiving system in said first frequency band and a second transmission/receiving system in said second frequency band;
a first switch circuit connected to said diplexer circuit for switching a transmission system and a receiving system in said first transmission/receiving system; and
a second switch circuit connected to said diplexer circuit for switching a transmission system and a receiving system in said second transmission/receiving system,
wherein said diplexer circuit and said first and second switch circuits are formed in or on a laminate comprising dielectric layers provided with electrode patterns, and
wherein for said diplexer circuit and said first and second switch circuits, transmission lines through which signals in said first frequency band pass are formed on one side of a ground electrode formed on a dielectric layer in said laminate in a lamination thickness direction, and transmission lines through which signals in said second frequency band pass are formed on an opposite side of said ground electrode in the lamination thickness direction.

15. The high-frequency module according to claim 14, wherein among transmission lines for said diplexer circuit and said first and second switch circuits, transmission lines through which signals in said first frequency band pass being formed on one side of a ground electrode formed on a dielectric layer in said laminate in a lamination direction, and transmission lines through which signals in said second frequency band pass being formed on the other side of said ground electrode in the lamination direction, and wherein said second frequency band is substantially the same as the frequency band of second harmonics in said first frequency band.

16. A high-frequency module for use in a multiband wireless communications apparatus selectively using at least a first frequency band and a second frequency band higher than said first frequency band, comprising:

a diplexer circuit for branching a first transmission/receiving system in said first frequency band and a second transmission/receiving system in said second frequency band;

a first switch circuit connected to said diplexer circuit for switching a transmission system and a receiving system in said first transmission/receiving system;

a second switch circuit connected to said diplexer circuit for switching a transmission system and a receiving system in said second transmission/receiving system; and a lowpass filter comprising an inductance-constituting transmission line and a capacitor, wherein said diplexer circuit and said first and second switch circuits are formed in or on a laminate comprising dielectric layers provided with electrode patterns, and wherein dielectric layers on which electrode patterns constituting said transmission line are formed and dielectric layers on which electrode patterns constituting said capacitor are separated by a ground electrode in a lamination thickness direction, and no opposing ground electrode is formed on an opposite side of said ground electrode in a lamination thickness direction with respect to the electrode patterns constituting said transmission line.

17. The high-frequency module according to claim 16, wherein no opposing ground electrode is formed on an opposite side of said ground electrode in the lamination thickness direction with respect to the electrode patterns constituting said capacitor.

18. The high-frequency module according to claim 17, comprising pluralities of said capacitors.

19. The high-frequency module according to claim 17, wherein at least one of said capacitors is parallel-connected to said transmission line.

* * * * *